(12) United States Patent
Matsukura et al.

(10) Patent No.: US 6,660,346 B2
(45) Date of Patent: Dec. 9, 2003

(54) PELLICLE

(75) Inventors: Ikuo Matsukura, Kanagawa (JP); Naoko Shirota, Kanagawa (JP); Jun Irisawa, Kanagawa (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 10/351,354

(22) Filed: Jan. 27, 2003

(65) Prior Publication Data

US 2003/0134057 A1 Jul. 17, 2003

Related U.S. Application Data

(62) Division of application No. 09/803,965, filed on Mar. 13, 2001, now Pat. No. 6,548,129.

(30) Foreign Application Priority Data

Mar. 15, 2000 (JP) ........................................ 2000-072718

(51) Int. Cl.[7] .................................................. B32B 3/00
(52) U.S. Cl. .................... 428/14; 428/421; 428/422; 430/5; 430/322; 355/30; 355/53
(58) Field of Search ........................ 428/14, 421, 422; 430/5, 322; 355/30, 53

(56) References Cited

U.S. PATENT DOCUMENTS

| | | | |
|---|---|---|---|
| 4,657,805 A | | 4/1987 | Fukumitsu et al. ......... 428/215 |
| 5,168,001 A | * | 12/1992 | Legare et al. ............... 428/194 |
| 5,378,514 A | * | 1/1995 | Hamada et al. ............. 428/14 |
| 5,422,704 A | | 6/1995 | Sego ........................... 355/53 |
| 5,693,382 A | * | 12/1997 | Hamada et al. ............. 428/14 |
| 5,966,490 A | * | 10/1999 | Minns et al. ............... 385/127 |

FOREIGN PATENT DOCUMENTS

| | | |
|---|---|---|
| EP | 416528 * | 9/1990 |
| EP | 0 416 517 | 3/1991 |
| EP | 0 416 528 | 3/1991 |
| JP | 2951337 | 7/1999 |
| JP | 2952962 | 7/1999 |
| WO | WO 96/07378 | 2/1998 |
| WO | 88/04070 | 6/1998 |
| WO | WO 98/46558 | 10/1998 |
| WO | WO 01/37043 | 5/2001 |
| WO | WO 01/37044 | 5/2001 |

* cited by examiner

Primary Examiner—David W. Wu
Assistant Examiner—Henry Hu
(74) Attorney, Agent, or Firm—Oblon, Spivak, McClelland, Maier & Neustadt, P.C.

(57) ABSTRACT

A pellicle for a photolithographic patterning process by means of a light having a wavelength of at most 200 nm, comprising a frame and a pellicle membrane bonded to the frame by means of an adhesive, wherein the pellicle membrane or the adhesive comprises the following fluorine-containing polymer (A):

fluorine-containing polymer (A): a substantially linear fluorine-containing polymer having a chain of carbon atoms as the main chain, and containing as carbon atoms in its main chain, a carbon atom having one or two hydrogen atoms bonded thereto and a carbon atom having no hydrogen atom bonded thereto and having a fluorine atom or a fluorine-containing organic group bonded thereto.

21 Claims, 1 Drawing Sheet

PELLICLE

BACKGROUND OF THE INVENTION

1. Field of the Invention

The present invention relates to a pellicle for photolithography using a light having a wavelength of at most 200 nm.

2. Discussion of Background

A pellicle is a dustproof integral device to be mounted on a photomask or a reticle (hereinafter they will be referred to as a mask) so as to prevent dust particles from depositing on the mask and to prevent pattern failure during exposure, used in photolithography as one step in production of semiconductor devices or liquid crystal display boards. As its structure, usually a transparent thin membrane bonded to a frame by using adhesives is mounted on the mask at some distance from the mask surface.

In fields of production of semiconductor devices and liquid crystal display panels in which such a pellicle is used, the wavelength of light sources to be used has been shortened rapidly also in photolithography, along with minimization of wiring and wiring interval. In a conventional exposure technique with a minimum pattern dimension of at least 0.3 μm, a process employing an i-beam light source (365 nm) has been mainly used, and as a material of a transparent thin membrane of a pellicle (hereinafter referred to as a pellicle membrane), a cellulose nitrate type material has been used.

In recent years, for a photolithographic patterning process with a minimum pattern dimension of at most 0.3 μm, a KrF excimer laser is being introduced, but its irradiation wavelength is 248 nm, and the cellulose nitrate type membrane material is inadequate in view of durability. Further, it has been found that an amorphous perfluoropolymer is effective as a membrane material in the case where a light having a short wavelength such as an excimer laser is employed (Japanese Patent No. 2951337 or Japanese patent No. 2952962).

On the other hand, for a photolithographic patterning process with a minimum pattern dimension of at most 0.2 μm under development in recent years, as a laser emitting a light having a wavelength of at most 200 nm, use of e.g. an argon fluoride excimer laser emitting a light having a wavelength of 193 nm (hereinafter referred to as an ArF excimer laser) or a fluorine gas excimer laser emitting a light having a wavelength of 157 nm (hereinafter referred to as a $F_2$ excimer laser) has been proposed.

However, since these laser lights have an extremely high energy, even the above amorphous perfluoropolymer as disclosed in Japanese Patent No. 2951337 is inadequate in view of durability. For example, of "CYTOP" (Japanese tradename) which is a perfluoropolymer used in the above patent, transmission of light and durability suddenly decrease at a wavelength shorter than 170 nm. This perfluoropolymer has a significantly low transmission of the $F_2$ excimer laser light having a wavelength of 157 nm. Therefore, development of a pellicle membrane which can be used for $F_2$ excimer laser light has been desired.

Moreover, with respect to adhesives for bonding the pellicle membrane to a frame, there are similar problems of degradation due to reflected light or scattering light of the laser. Thus the adhesive having a high durability has also been desired.

SUMMARY OF THE INVENTION

The present inventors have found a fluorine-containing polymer having a high durability and a high transmission of a laser light for irradiation which has a wavelength of at most 200 nm (particularly at most 180 nm) (hereinafter referred to as a short-wavelength laser light). The present invention relates to a pellicle employing this fluorine-containing polymer as a pellicle membrane or as an adhesive.

Namely, the present invention provides a pellicle for an exposure treatment by means of a light having a wavelength of at most 200 nm, comprising a frame and a pellicle membrane bonded to the frame by means of an adhesive, wherein the pellicle membrane or the adhesive comprises the following fluorine-containing polymer (A):

fluorine-containing polymer (A): a substantially linear fluorine-containing polymer having a chain of carbon atoms as the main chain, and containing as carbon atoms in its main chain, a carbon atom having one or two hydrogen atoms bonded thereto and a carbon atom having no hydrogen atom bonded thereto and having a fluorine atom or a fluorine-containing organic group bonded thereto.

DETAILED DESCRIPTION OF THE PREFERRED EMBODIMENTS

Figure 1:
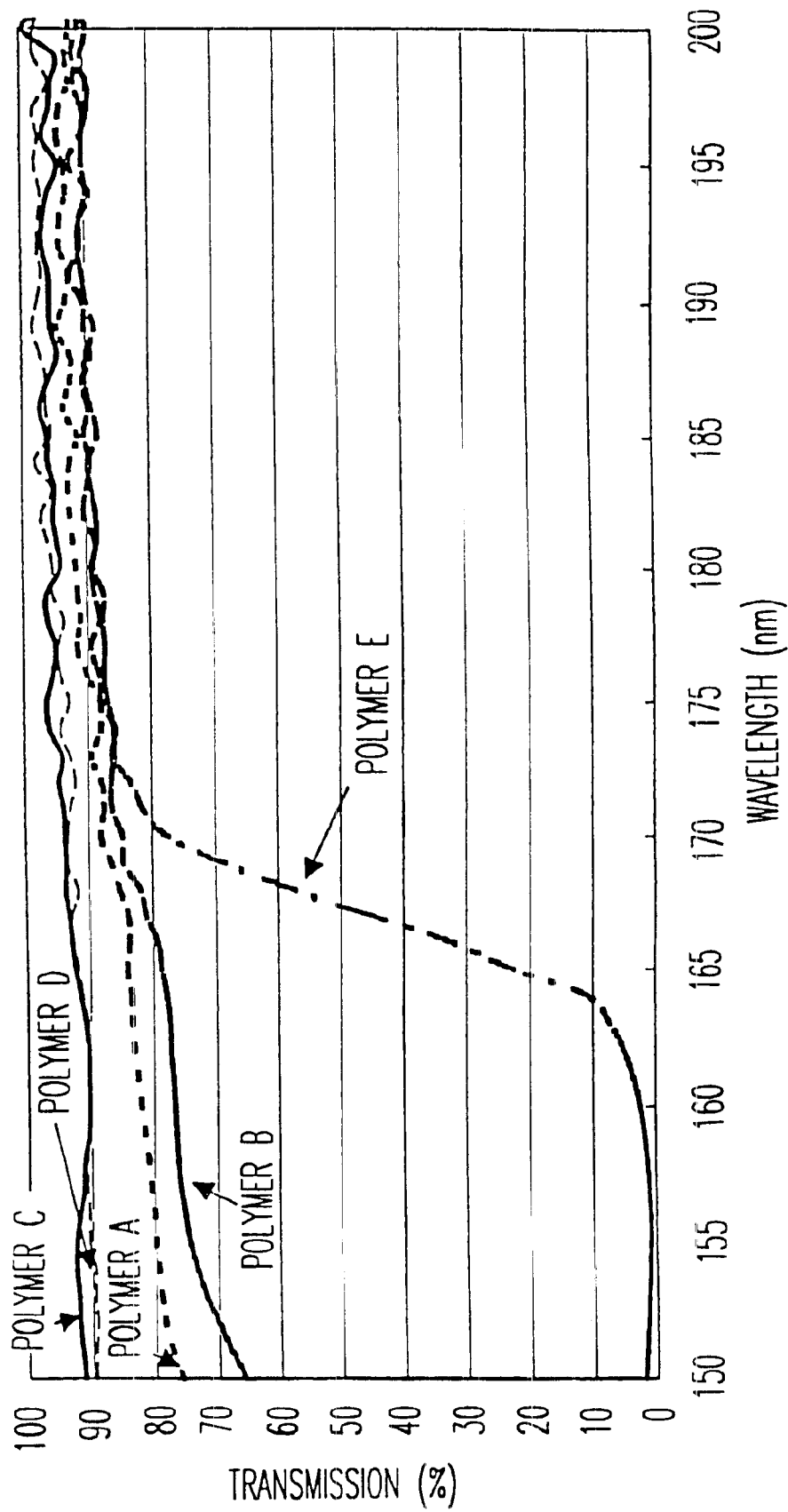
FIG. 1 is a diagram illustrating transmissions of light through membranes comprising a polymer A, a polymer B, a polymer C, a polymer D and a polymer E, respectively, as against a wavelength.

The pellicle of the present invention is particularly suitable as a pellicle for a photolithographic patterning process by means of a light having a wavelength of at most 180 nm, which is a light having a wavelength shorter than that of an ArF excimer laser light. Specifically, it is suitable as a pellicle for a photolithographic patterning process by means of a $F_2$ excimer laser light having a wavelength of 157 nm.

The fluorine-containing polymer (A) of the present invention is a substantially linear fluorine-containing polymer having a chain of carbon atoms as the main chain. The chain of carbon atoms as the main chain of the polymer comprises chains of two carbon atoms constituting a polymerizable unsaturated bond of a monomer connected in principle. Therefore, with respect to the fluorine-containing polymer (A), "containing as carbon atoms in its main chain, a carbon atom having one or two hydrogen atoms bonded thereto and a carbon atom having no hydrogen atom bonded thereto and having a fluorine atom or a fluorine-containing organic group bonded thereto" means that in a case of a homopolymer obtained by polymerization of a monomer having one polymerizable unsaturated group, it is a polymer of a monomer having two carbon atoms constituting a polymerizable unsaturated bond of the monomer, one carbon atom having a hydrogen atom bonded thereto and the other carbon atom having no hydrogen atom bonded thereto (hereinafter referred to as a monomer (a)).

In a case of a copolymer, it may be a copolymer of a monomer having two carbon atoms constituting a polymerizable unsaturated bond, at least one of the two carbon atoms having a hydrogen atom bonded thereto (hereinafter referred to as a monomer (b)) and a monomer having two carbon atoms constituting a polymerizable unsaturated bond, both of the two carbon atoms having no hydrogen atom bonded thereto (hereinafter referred to as a monomer (c)).

Further, the fluorine-containing polymer (A) may be a copolymer of at least two types of the monomer (a), or it may be a copolymer of the monomer (a) and another monomer. Further, it may be a copolymer of the monomer (b), the monomer (c) and another monomer.

The fluorine-containing polymer (A) may be a polymer obtained by cyclic polymerization of a monomer having two polymerizable unsaturated bonds. In the case of this polymer, usually four carbon atoms constituting the two polymerizable unsaturated bonds form the main chain of the polymer. Therefore, said fluorine-containing polymer (A) is a polymer obtained by cyclic polymerization of a monomer having four carbon atoms constituting two polymerizable unsaturated bonds, at least one of the carbon atoms having a hydrogen atom bonded thereto, and at least one of the carbon atoms having no hydrogen atom bonded thereto (hereinafter referred to as monomer (d)).

In a case of a copolymer, it may be a copolymer of a monomer having four carbon atoms, each having no hydrogen atom bonded thereto (hereinafter referred to as monomer (e)) and a monomer which has a carbon atom having a hydrogen atom bonded thereto in a polymerizable unsaturated bond (said monomer may be a monomer having two polymerizable unsaturated bonds, which may undergo cyclic polymerization, or may be a monomer having one polymerizable unsaturated bond) (hereinafter referred to as monomer (f)). Further, the fluorine-containing polymer (A) may be a copolymer of the monomer (d) and another monomer, or it may be a copolymer of the monomer (e), the monomer (f) and another monomer.

Since the fluorine-containing polymer (A) is a polymer having fluorine, the above monomers (a), (c), (d) and (e) have to have a fluorine atom or a fluorine-containing organic group bonded to a carbon atom in the polymerizable unsaturated bond. It is not essential for the monomers (b) and (f) to have a fluorine atom or a fluorine-containing organic group is bonded to a carbon atom in the polymerizable unsaturated bond. However, they may have such an atom or a group bonded to a carbon atom.

As the fluorine-containing organic group, preferred are a monovalent group and a bivalent group. In the case of a bivalent fluorine-containing organic group, it may be bonded to each of two carbon atoms in the polymerizable unsaturated bond (whereby a ring containing the two carbon atoms is formed), or it may be bonded to one of the two carbon atoms (whereby a ring containing said one carbon atom is formed, and the other carbon atom is a carbon atom outside the ring).

The monomers (a) to (f) may have an atom, an organic group or another substituent other than a hydrogen atom, a fluorine atom and a fluorine-containing organic group, on the carbon atom in the polymerizable unsaturated bond. For example, they may have a halogen atom other than a fluorine atom, such as a chlorine atom, or an organic group such as an alkyl group. However, with respect to a polymer having a large number of organic groups such as alkyl groups in its side chains, hydrogen atoms bonded to the carbon atoms tend to decrease the durability, thus the number of such substituents is preferably small.

As the monovalent fluorine-containing organic group, the preferred one is a fluorine-containing alkyl group or a fluorine-containing alkoxy group. The carbon number of such a group is preferably at most 10, particularly preferably at most 4. Such a group preferably contains no hydrogen, and preferred is a group containing fluorine atoms alone (i.e. a perfluoroalkyl group or a perfluoroalkoxy group), or a perhalo-polyfluoroalkyl group or a perhalo-polyfluoroalkoxy group containing fluorine atoms and a small number of chlorine atoms as compared with the number of fluorine atoms. Further, in a case of the fluorine-containing polymer (A) to be used as an adhesive, a fluorine-containing organic group having a functional group effective for improvement in adhesion may be contained. The monovalent fluorine-containing organic group is not limited to a linear one, and may be branched.

As the bivalent fluorine-containing organic group, preferred is a polyfluoroalkylene group having a carbon number of at most 10 (particularly preferably at most 6) which may contain an etherial oxygen atom. As the polyfluoroalkylene group, preferred is a perfluoroalkylene group or a perhalo-polyfluoroalkylene group containing a small number of chlorine atoms. The etherial oxygen atom may be present on one terminal of the polyfluoroalkylene group, may be present on each terminal, or may be present between carbon atoms. The bivalent fluorine-containing organic group is not limited to a linear one, and may be branched.

As a monovalent organic group other than the monovalent fluorine-containing organic group, preferred is an alkyl group or an alkoxy group containing no fluorine atom or monovalent fluorine-containing organic group as mentioned above. The carbon number of the alkyl group or alkoxy group is preferably at most 10, particularly preferably at most 4. As said monovalent organic group other than the monovalent fluorine-containing organic group, particularly preferred is a methyl group.

A polymer having crystalline property tends to decrease transmission due to light scattering and to cause distortion of a reticle image. Therefore, the fluorine-containing polymer (A) is preferably amorphous with a crystalline property of at most 30%, particularly preferably at most 20%. The crystalline property of the polymer can be lowered by introducing a bulky structure into a polymer chain. Therefore, it is preferred to make an alicyclic structure having a bulky structure be present in the main chain of the polymer to reduce crystallization of the polymer and to obtain an amorphous polymer having a high transparency. Therefore, as the fluorine-containing polymer (A), particularly preferred is a fluorine-containing polymer having an alicyclic structure in its main chain.

"Having an alicyclic structure in its main chain" means that at least one carbon atom in the main chain is a carbon atom constituting the alicyclic structure. This alicyclic structure is preferably a fluorine-containing alicyclic structure having a fluorine atom or a fluorine-containing organic group bonded to at least one carbon atom constituting the alicyclic structure. Further, a part of atoms constituting the alicyclic structure may be an atom other than a carbon atom, such as an oxygen atom or a nitrogen atom. Preferred as the alicyclic structure is a 4- to 8-membered fluorine-containing alicyclic structure having one or two oxygen atoms.

By using a monomer having a polymerizable unsaturated group in an alicyclic structure, a polymer having an alicyclic structure in its main chain can be obtained. The monomer (d) or (e) forms a polymer having an alicyclic structure in its main chain by cyclic polymerization. "Having a polymerizable unsaturated group in an alicyclic structure" means that a polymerizable unsaturated group is present between carbon atoms constituting the alicyclic structure, or a polymerizable unsaturated group is present between a carbon atom constituting the ring and a carbon atom outside the ring. As the alicyclic structure, preferred is a fluorine-containing alicyclic structure, and it may have an oxygen atom as an atom constituting the ring, as mentioned above.

Hereinafter the monomer having a polymerizable unsaturated group in a fluorine-containing alicyclic structure will be referred to as a fluorine-containing unsaturated alicyclic monomer. As atoms constituting the ring in the fluorine-containing unsaturated alicyclic monomer, one or two oxygen atoms may be contained in addition to carbon atoms. The monomer (c) is preferably a fluorine-containing unsaturated alicyclic monomer. The monomer (a), (b) or (f) may be a fluorine-containing unsaturated alicyclic monomer.

As the monomer (a), preferred is vinylidene fluoride or trifluoroethylene. However, a homopolymer of such a monomer tends to be crystalline, and tends to have a low transparency.

As the monomer (b), preferred is a monomer represented by $CHR^1=CR^2R^3$, wherein each of $R^1$, $R^2$ and $R^3$ which are independent of one another, is a hydrogen atom, a fluorine atom or a monovalent organic group. Each of $R^1$ and $R^2$ is preferably a hydrogen atom or a fluorine atom, and $R^3$ is preferably a hydrogen atom, a fluorine atom or a monovalent organic group having a carbon number of at most 4. Specifically, an olefin such as ethylene or propylene, or a fluoroolefin having a hydrogen atom bonded to a carbon atom in a polymerizable unsaturated group, such as vinyl fluoride, 1,2-difluoroethylene, vinylidene fluoride or trifluoroethylene, may be mentioned. As the monomer (b), preferred are a $C_{2-3}$ olefin and a $C_{2-3}$ fluoroolefin. Particularly preferred as the monomer (b) are an olefin selected from ethylene and propylene and a fluoroolefin selected from vinyl fluoride, 1,2-difluoroethylene and vinylidene fluoride.

As the monomer (c), preferred is a monomer represented by $CFR^4=CR^5R^6$, wherein each of $R^4$, $R^5$ and $R^6$ which are independent of one another, is a fluorine atom or a monovalent fluorine-containing organic group, or $R^4$ and $R^5$ together form a bivalent fluorine-containing organic group and $R^6$ is a fluorine atom or a monovalent fluorine-containing organic group, or $R^5$ and $R^6$ together form a bivalent fluorine-containing organic group and $R^4$ is a fluorine atom or a monovalent fluorine-containing organic group. The monomer (c) wherein $R^4$ and $R^5$ together form a bivalent fluorine-containing organic group and $R^6$ is a fluorine atom or a monovalent fluorine-containing organic group, or $R^5$ and $R^6$ together form a bivalent fluorine-containing organic group and $R^4$ is a fluorine atom or a monovalent fluorine-containing organic group, is one type of a fluorine-containing unsaturated alicyclic monomer, and hereinafter such a monomer will be referred to as a fluorine-containing unsaturated alicyclic monomer (c).

As the monomer (c), specifically, a polyfluoroolefin having no hydrogen atom, such as tetrafluoroethylene, chlorotrifluoroethylene or hexafluoropropylene, perfluoro(alkyl vinyl ether) or a fluorine-containing unsaturated alicyclic monomer (c) represented by the following formula 1, 2 or 3, may, for example, be mentioned. Particularly preferred as the monomer (c) is perfluoro(2,2-dimethyl-1,3-dioxole) i.e. a compound represented by the formula 1 wherein both $R^{11}$ and $R^{12}$ are trifluoromethyl groups.

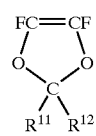

Formula 1

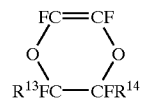

Formula 2

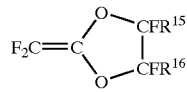

Formula 3

In the above formulae 1 to 3, each of $R^{11}$ to $R^{16}$ which are independent of one another, is a fluorine atom or a fluorine-containing organic group, and as the fluorine-containing organic group, preferred is a perfluoroalkyl group, and particularly preferred is a perfluoroalkyl group having a carbon number of 1 or 2.

The fluorine-containing polymer (A) comprising a copolymer of the monomers (b) and (c) may be a polymer having no fluorine-containing alicyclic structure in its main chain, such as an ethylene/tetrafluoroethylene copolymer, a propylene/tetrafluoroethylene copolymer, a propylene/vinylidene fluoride/tetrafluoroethylene copolymer or a vinylidene fluoride/hexafluoropropylene copolymer, but their transparency is not adequate. However, they are useful as an adhesive for bonding a membrane to a frame. Preferred as the fluorine-containing polymer (A) is a copolymer of the monomer (b) with the fluorine-containing unsaturated alicyclic monomer (c) represented by the above formula 1, 2 or 3. In such a case, as the monomer (b), preferred is at least one monomer selected from olefins such as ethylene and fluoroolefins having a hydrogen atom bonded to a carbon atom in the unsaturated group.

The proportion of monomer units formed by polymerization of the monomer (b) (hereinafter referred to as monomer units (b), and the same applies to the other monomer units) in the copolymer of the monomer (b) and the monomer (c) to the total of the monomer units (b) and the monomer units (c) is preferably from 10 to 70 mol %. In a case where the monomer (b) is a monomer having at least two hydrogen atoms (hydrogen atoms bonded to a carbon atom in a polymerizable unsaturated bond) such as ethylene, it is preferably from 10 to 50 mol %. The proportion of the monomer units (b) is particularly preferably from 20 to 40 mol %. In the case of the fluorine-containing polymer (A) for an adhesive, a polymer having a proportion of the monomer units (b) to the total of the monomer units (b) and the monomer units (c) of from 40 to 85 mol % is also preferred.

Here, the proportion of the total of the monomer units (b) and the monomer units (c) to the total monomer units in the polymer is preferably from 50 to 100 mol %, particularly preferably from 80 to 100 mol %. The most preferred polymer is a copolymer of the monomer (b) and the monomer (c) alone, provided that each monomer may consist of at least two types.

As the monomer (d), preferred is a monomer represented by $CH_2=CR^7-Q-CR^8=CF_2$, wherein each of $R^7$ and $R^8$ which are independent of each other, is a hydrogen atom, a fluorine atom or a monovalent fluorine-containing organic group, and Q is a bivalent fluorine-containing organic group. As $R^7$, preferred is a hydrogen atom or a fluorine atom, and particularly preferred is a hydrogen atom. As $R^8$, preferred is a fluorine atom or a perfluoroalkyl group having a carbon number of at most 2, and particularly preferred is a fluorine atom.

As Q, preferred is a perfluoroalkylene group having a carbon number of at most 10, which may have an etherial oxygen atom. The etherial oxygen atom may be present at one terminal of the perfluoroalkylene group, may be present on each terminal, or may be present between carbon atoms. In a case of a perfluoroalkylene group having no etherial oxygen atom, the carbon number is more preferably from 2 to 6, in the case of a perfluoroalkylene group having an etherial oxygen atom on one terminal or between carbon atoms, the carbon number is more preferably from 1 to 4, and in the case of a perfluoroalkylene group having an etherial oxygen atom on each terminal, the carbon number is more preferably from 1 to 3. The total number of oxygen atoms and carbon atoms excluding carbon atoms at a branched moiety, is most preferably from 2 to 4.

As Q, preferred is a perfluoroalkylene group having a carbon number of at most 4 and having an etherial oxygen atom at a 2,2-difluorovinyl group side, a perfluoroalkylene group having a carbon number of at most 4 and having an etherial oxygen atom between carbon atoms, or a perfluoroalkylene group having a carbon number of at most 4 and having no etherial oxygen atom. More preferred as Q is a perfluoroalkylene group having a carbon number of at most 4 and having an etherial oxygen atom at a 2,2-difluorovinyl group side.

That is to say, the most preferred monomer (d) is a monomer represented by $CH_2=CH-R^f-O-CF=CF_2$, wherein $R^f$ is a $C_{1-4}$ perfluoroalkylene group. This monomer is polymerized easily by cyclopolymerization, and, a polymer having a high transmission to a short-wavelength light and having a high mechanical strength can be obtained (JP-A-63-238111, JP-A-63-238113). As $R^f$, preferred is a perfluoroalkylene group having a carbon number of from 1 to 3 excluding a branch. In a case where $R^f$ is branched, the branch is preferably a trifluoromethyl group, and the number of the branch is preferably from 1 to 2.

Here, by cyclic polymerization of $CH_2=CR^7-Q-CR^8=CF_2$, monomer units represented by e.g. the following formula 4, 5 or 6 are usually formed. As the monomer (d) represented by $CH_2=CR^7-Q-CR^8=CF_2$, the following compounds may, for example, be mentioned.

Formula 4

Formula 5

Formula 6

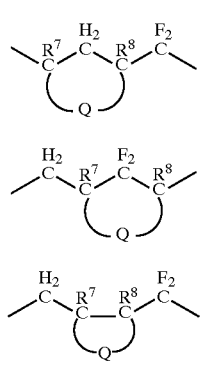

$CH_2=CHCF_2CF_2OCF=CF_2$,
$CH_2=CHCF_2CF_2CF_2OCF=CF_2$,
$CH_2=CHCF_2OCF=CF_2$,
$CH_2=CHCF(CF_3)CF_2OCF=CF_2$,
$CH_2=CHCF_2OCF_2CF=CF_2$,
$CH_2=CHCF_2CCl_2OCF=CF_2$,
$CH_2=CFCF_2CF_2OCF=CF_2$,
$CH_2=CFCF(CF_3)CF_2OCF=CF_2$.

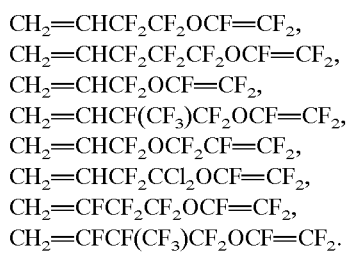

The fluorine-containing polymer (A) may be a homopolymer of the monomer (d), provided that it may be a copolymer of at least two types of the monomer (d), or may be a copolymer of the monomer (d) with another monomer. As said another monomer, the monomer (a), (b), (c) or (e) may, for example, be mentioned. As the copolymer, preferred is a copolymer of the monomer (d) and the monomer (c) or a copolymer of the monomer (d) and the monomer (e), and more preferred is a copolymer of the monomer (d) and the monomer (c). In such a case, as the monomer (c), preferred is the above fluorine-containing unsaturated alicyclic monomer (c).

The proportion of the monomer units (d) to the total monomer units in the fluorine-containing polymer (A) is suitably from 30 to 100%, preferably from 50 to 100%, and most preferably 100%.

As the monomer (e), preferred is a monomer having all hydrogen atoms bonded to carbon atoms in the polymerizable unsaturated group in the monomer (d) replaced by fluorine atoms or perfluoroalkyl groups. More preferred is a monomer represented by $CF_2=CR^9-Q-CR^{10}=CF_2$, wherein each of $R^9$ and $R^{10}$ which are independent of each other, is a fluorine atom or a monovalent fluorine-containing organic group, and Q is as defined above. However, the position or the number of the etherial oxygen atom in Q is not restricted. Specifically, the following monomers may be mentioned.

$CF_2=CFCF_2CF_2OCF=CF_2$,
$CF_2=CFCF_2CF_2CF_2OCF=CF_2$,
$CF_2=CFCF_2OCF=CF_2$,
$CF_2=CFCF(CF_3)CF_2OCF=CF_2$,
$CF_2=CFOCF_2OCF=CF_2$,
$CF_2=CFOC(CF_3)_2OCF=CF_2$,
$CF_2=CFCF_2CCl_2OCF=CF_2$.

As the monomer (f), the above monomer (a) or (b) may be used. The monomer (b) is particularly preferred. In copolymerization of the monomer (e) and the monomer (f), the monomer (e) forms monomer units having a fluorine-containing alicyclic structure by cyclic polymerization, and a copolymer having the monomer units (e) and the monomer units (f) will be formed. The copolymer having the monomer units (e) and the monomer units (f) may further have another monomer units such as the above monomer units (c).

In the copolymer of the monomer (e) and the monomer (f), the proportion of the monomer units (f) to the total of the monomer units (e) and the monomer units (f) is preferably from 10 to 70 mol %. In the case of the monomer (f) having at least two hydrogen atoms (hydrogen atoms bonded to carbon atoms in the polymerizable unsaturated bond) such as ethylene, it is preferably from 10 to 60 mol %. The proportion of the monomer units (f) is particularly preferably from 20 to 50 mol %. Here, the proportion of the total of the monomer units (e) and the monomer units (f) to the total monomer units in the polymer is preferably from 50 to 100 mol %, particularly preferably from 70 to 100 mol %.

The fluorine-containing polymer (A) is preferably a polymer containing monomer units having a fluorine-containing alicyclic structure, as mentioned above. The proportion of the monomer units having a fluorine-containing alicyclic structure to the total monomer units in the fluorine-containing polymer (A) is preferably at least 20 mol %, particularly preferably at least 40 mol %.

Particularly preferred as the fluorine-containing polymer (A) are a copolymer of ethylene and perfluoro(2,2-dimethyl-1,3-dioxole), a homopolymer of the monomer (d) and the copolymer of the fluorine-containing unsaturated alicyclic monomer (c) and the monomer (d).

According to studies by the present inventors, it is considered that if carbon atoms having a fluorine atom bonded thereto (particularly $CF_2$ groups) alone are continuously present in a large amount in the chain of carbon atoms in the main chain of the fluorine-containing polymer (A), the electron transition energy of said part will decrease, whereby a light having a wavelength of at most 170 nm tends to be absorbed, and a transmission will be lowered. It is considered that the same applies to a case where carbon atoms having hydrogen atoms bonded thereto (particularly $CH_2$ groups) alone are continuously present in a large amount. Therefore, it is unfavorable that a block of continuous monomer units such as the monomer units (c) or (e) alone in a large amount is present in the polymer (the same applies to the other monomer units such as the monomer units (b) or (f)).

With respect to the above chain of the monomer units alone, the number of the monomer units is preferably at most 10, particularly preferably at most 8, on the average in the entire polymer. Therefore, the fluorine-containing polymer (A) as a copolymer is preferably a random copolymer, as well as having the above proportion of the monomer units.

A pellicle membrane is usually produced by using a solution of the fluorine-containing polymer (A). The solvent is not particularly limited so long as it dissolves the polymer, and preferred is a fluorine-containing solvent in which the polymer is highly soluble. For example, the following fluorine-containing solvents may be used.

Polyfluoroaromatic compounds such as perfluorobenzene, pentafluorobenzene and 1,3-bis(trifluoromethyl)benzene. Polyfluorotrialkylamine compounds such as perfluorotributylamine and perfluorotripropylamine. Polyfluorocycloalkane compounds such as perfluorodecalin and perfluorocyclohexane. Polyfluorocyclic ether compound such as perfluoro(2-butyltetrahydrofuran).

Polyfluoroalkanes such as perfluorooctane, perfluorodecane, 1,3-dichloro-1,1,2,2,3-pentafluoropropane, 2H,3H-perfluoropentane and 1H-perfluorohexane. Polyfluoroethers such as methyl perfluoroisopropyl ether, methyl perfluorobutyl ether, methyl (perfluorohexylmethyl) ether, methyl perfluorooctyl ether and ethyl perfluorobutyl ether.

As a method of producing a pellicle membrane from the polymer solution, a method of forming a thin membrane of the polymer on a substrate by means of several coating methods from the solution, such as roll coating, casting, dip coating, spin coating, water casting, die coating or Langmuir Blodgett, may be employed. The thickness of the membrane is usually selected within a range of from 0.01 to 50 $\mu$m. In the case of a pellicle membrane, extremely strict membrane thickness control is required, and therefore it is more preferred to employ spin coating. As the substrate, preferred is a silicon wafer, quartz glass or the like having a smooth surface.

As the fluorine-containing polymer (A) for an adhesive, preferred is a polymer similar to the fluorine-containing polymer (A) preferred as a pellicle membrane. For example, a copolymer of the fluorine-containing unsaturated alicyclic monomer (c) and the monomer (b), a polymer of the monomer (d) or a copolymer of the monomer (e) and the monomer (f) is preferred. Further, for the fluorine-containing polymer (A) for an adhesive, a high transparency is not necessarily required, and therefore it may be the polymer having no fluorine-containing alicyclic structure in its main chain. Therefore, a copolymer of the monomer (b) and the monomer (c) other than the fluorine-containing unsaturated alicyclic monomer (c) (i.e. the fluorine-containing polymer (A) having no alicyclic structure in its main chain) may also be used as a preferred adhesive.

The fluorine-containing polymer (A) having no alicyclic structure in its main chain may, for example, be a propylene/vinylidene fluoride/tetrafluoroethylene copolymer or a vinylidene fluoride/hexafluoropropylene copolymer. In such a polymer, the proportion of the monomer units (b) to the total of the monomer units (c) and the monomer units (b) is preferably from 40 to 85 mol %, particularly preferably from 50 to 80 mol %.

Further, in a case where the fluorine-containing polymer (A) is used as an adhesive for bonding a pellicle membrane to a frame for a pellicle, it is preferred to use the fluorine-containing polymer (A) having functional groups effective for improvement in adhesion introduced thereinto. Here, the fluorine-containing polymer (A) for a pellicle membrane preferably contains no functional group from the viewpoint of transmission of light.

The functional group in the fluorine-containing polymer (A) containing functional groups, is not particularly limited so long as it can present adhesion to a frame or a pellicle membrane, and a carboxylic acid group, a sulfonic acid group, a group having an ester linkage, an alkenyl group, a hydrolyzablel silyl group, a hydroxyl group, a maleimide group, an amino group, a cyano group or an isocyanate group may, for example, be mentioned. As the functional group, particularly suitable is a carboxylic acid group from the viewpoint of excellent adhesion to a metal such as aluminum as a frame material, excellent storage stability and effective adhesion obtainable at a relatively low temperature.

The number of the functional groups in the fluorine-containing polymer (A) is preferably from 0.001 to 1 mmol per g of the polymer. In a case where the number of the functional groups exceeds 1 mmol, there is a possibility that absorption by the functional groups may impair durability of the adhesive.

A polymer having a fluorine-containing alicyclic structure in its main chain and having adhesive functional groups introduced thereinto and a production method thereof are known (JP-A-4-189880, JP-A-4-226177, JP-A-6-220232). The known polymer having a fluorine-containing alicyclic structure in its main chain is a copolymer of the above monomer (c) or a polymer of the monomer (e).

Also with respect to the fluorine-containing polymer (A) having functional groups, functional groups can be introduced in the same manner as the above known polymer. For example, a method of utilizing terminal groups of the polymer obtained by polymerization, a method of copolymerizing a monomer having an alkoxycarbonyl group and subjecting the resulting polymer to hydrolysis, or a method of subjecting a polymer to a high-temperature treatment so that side chains or terminals of the polymer undergo oxidative destruction to form functional groups, may, for example, be mentioned.

Further, with the fluorine-containing polymer (A) or the fluorine-containing polymer (A) containing functional groups to be used as an adhesive, an adhesion promotor such as a silane type, epoxy type, titanium type or aluminum type coupling agent, may be mixed so as to improve adhesion. Further, it is also possible to thinly coat the fluorine-containing polymer (A) containing functional groups on a frame, and to apply the fluorine-containing polymer (A) having no functional group thereto, so as to obtain strong adhesion.

Now, the present invention will be explained in further detail with reference to Examples. However, it should be understood that the present invention is by no means restricted to such specific Examples.

EXAMPLE 1

Synthesis Example of Fluorine-containing Polymer (A)

20 g of 1,1,2,4,4,5,5-heptafluoro-3-oxa-1,6-heptadiene ($CH_2$=$CHCF_2CF_2OCF$=$CF_2$) and 40 g of trichlorotrifluoroethane were put in an autoclave made of pressure-resistant glass having an internal volume of 200 ml, the atmosphere in which was replaced by nitrogen. As a polymerization initiator, 20 mg of bis(heptafluorobutyryl)peroxide was added, the atmosphere in the autoclave was replaced by nitrogen again, and polymerization was carried out at 18° C. for 10 hours. As a result, 10 g of an amorphous polymer having a fluorine-containing alicyclic structure in its main chain (hereinafter referred to as polymer A) was obtained.

The intrinsic viscosity [$\eta$] of the polymer A was 0.96 in 1,3-bis(trifluoromethyl)benzene at 30° C. The polymer A had a glass transition temperature of 90° C., was a tough transparent vitreous polymer, and had a refractive index of 1.36.

On the other hand, the polymer A obtained by the same method as mentioned above, was subjected to a heat treatment in air at 320° C. for 3 hours and soaked in water for modification. From IR spectrum measurement of the modified polymer A, a peak assigned to carboxyl groups was confirmed, with an amount of 0.005 mmol/g. Hereinafter this modified polymer A will be referred to as adhesive A.

EXAMPLE 2

Synthesis Example of Fluorine-containing Polymer (B)

Perfluoro(2,2-dimethyl-1,3-dioxole) (hereinafter referred to as PDD) and ethylene with a molar ratio of 70:30 were subjected to radical polymerization using diisopropyl peroxydicarbonate as an initiator to obtain an amorphous polymer having a fluorine-containing alicyclic structure in its main chain (hereinafter referred to as polymer B) having a glass transition temperature of 80° C. and a 10% heat decomposition temperature of 330° C. The polymer B was a tough transparent polymer having an elastic modulus of 1.6 GPa at room temperature, and had a refractive index of 1.35.

EXAMPLE 3

Synthesis Example of Fluorine-containing Polymer (C)

30 g of 1,1,2,4,5,5-hexafluoro-3-oxa-4-trifluoromethyl-1,6-heptadiene ($CH_2$=$CHCF(CF_3)CF_2OCF$=$CF_2$) and 70 g of 1H-perfluorohexane($CF_3CF_2CF_2CF_2CF_2CF_2H$) were put in an autoclave made of pressure-resistant glass having an internal volume of 100 ml, the atmosphere in which was replaced by nitrogen.

17 mg of bis(heptafluorobutyryl)peroxide as a polymerization initiator was added, and the atmosphere in the autoclave was replaced by nitrogen again, and polymerization was carried out at 25° C. for 20 hours. As a result, 24 g of an amorphous polymer having a fluorine-containing alicyclic structure in its main chain (hereinafter referred to as polymer C) was obtained.

The intrinsic viscosity [$\eta$] of the polymer C was 0.60 in perfluoro(2-butyltetrahydrofuran) at 30° C. The polymer C had a glass transition temperature of 108° C., was a tough transparent vitreous polymer at room temperature, and had a refractive index of 1.34.

EXAMPLE 4

Synthesis Example of Fluorine-containing Polymer (D)

20 g of 1,1,2,4,5,5-hexafluoro-3-oxa-4-trifluoromethyl-1,6-heptadiene, 7.5 g of PDD and 70 g of 1H-perfluorohexane were put in an autoclave made of pressure-resistant glass having an internal volume of 100 ml, the atmosphere in which was replaced by nitrogen.

23 mg of bis(heptafluorobutyryl)peroxide as a polymerization initiator was added, the atmosphere in the autoclave was replaced by nitrogen again, and polymerization was conducted at 25° C. for 30 hours. As a result, 15 g of an amorphous polymer having a fluorine-containing alicyclic structure in its main chain (hereinafter referred to as polymer D) was obtained.

The intrinsic viscosity [$\eta$] of the polymer D was 0.45 in perfluoro(2-butyltetrahydrofuran) at 30° C. The polymer D was a tough transparent vitreous polymer at room temperature.

EXAMPLE 5

Synthesis Example of Perfluoropolymer 35 g of perfluoro(butenyl vinyl ether), 150 g of deionized water, 6 g of methanol as a chain transfer agent and 90 mg of diisopropyl peroxydicarbonate as a polymerization initiator were put in an autoclave made of pressure-resistant glass having an internal volume of 200 ml. The atmosphere in the autoclave was replaced by nitrogen, and suspension polymerization was carried out at 40° C. for 22 hours to obtain 33 g of an amorphous perfluoropolymer having a fluorine-containing alicyclic structure in its main chain and having terminal groups (—COF groups) derived from the initiator.

The intrinsic viscosity [$\theta$] of the polymer was 0.35 in perfluoro(2-butyltetrahydrofuran) at 30° C., and the glass transition temperature was 108° C. The polymer was a tough transparent vitreous polymer at room temperature, and had a 10% thermal decomposition temperature of 465° C.

This polymer was dissolved in perfluorotributylamine so that the concentration became 6%, the solution was put in an autoclave made of nickel having an internal volume of 1 l, and a 20% fluorine gas was introduced until the pressure became 0.7 MPa·G, followed by fluorination with stirring at 195° C. for 10 hours, to obtain a polymer having no terminal group derived from the initiator (hereinafter referred to as polymer E). The infrared absorption spectrum of the compression molded film of the obtained polymer was measured, whereupon no characteristic absorption at 1,883 $cm^{-1}$ derived from —COF groups was confirmed.

On the other hand, the amorphous perfluoropolymer having terminal groups (—COF groups) derived from the initiator, obtained by the same method as mentioned above, was subjected to heat treatment in air at 320° C. for 3 hours and then soaked in water for modification. By measuring IR spectrum of the modified polymer, a peak assigned to carboxyl groups was confirmed with an amount of 0.02 mmol/g. Hereinafter the modified polymer will be referred to as an adhesive E.

EXAMPLE 6

7 g of the polymer A and 93 g of 1,3-bis(trifluoromethyl)benzene were put in a flask made of glass, followed by heating at 40° C. for 24 hours with stirring. As a result, a uniform colorless and transparent solution without turbidity was obtained. This solution was coated on a polished glass plate by spin coating for 10 seconds at 500 rpm and for 20 seconds at 2,000 rpm, followed by heat treatment for 1 hour at 80° C. and further for 1 hour at 180° C. to obtain a uniform transparent membrane on the glass plate.

On the other hand, a solution obtained by treating 7 g of the adhesive A and 93 g of 1,3-bis(trifluoromethyl)benzene in the same manner as mentioned above, was coated on an aluminum frame, followed by drying at room temperature for 2 hours. Then, the aluminum frame was put on a hot plate at 120° C. so that the adhesive surface turned up, followed by heating for 10 minutes, and the above glass plate having the membrane of the polymer A formed thereon was press-bonded on the frame so that the membrane face the frame, and the assembly was held at 120° C. for 10 minutes to complete bonding. Then, the membrane was separated from the glass plate to obtain a pellicle comprising the aluminum frame and a uniform self-supporting membrane of about 1 $\mu$m thickness comprising the polymer A bonded to the frame.

Using 7 g of the polymer B and 93 g of 1,3-bis(trifluoromethyl)benzene, using 7 g of the polymer C and 93 g of perfluorotributylamine, and using 7 g of the polymer D and 93 g of perfluorotributylamine, pellicles comprising an aluminum frame and a uniform self-supporting membrane of about 1 $\mu$m thickness comprising each polymer bonded to the frame, were obtained. Each of these membranes had a transmission of light having a wavelength of 157 nm of at least 95%.

The pellicles having a membrane comprising each of the polymers A to D were subjected to an irradiation test by means of a $F_2$ excimer laser light having a wavelength of 157 nm, to be used for photolithography, whereupon the membranes comprising each of the polymers A to D showed excellent durability. Further, no separation of the membrane was observed, and the adhesive A also showed a good durability.

EXAMPLE 7

Using as an adhesive a propylene/vinylidene fluoride/tetrafluoroethylene copolymer (copolymer having a content (mol %) of propylene units: vinylidene fluoride units: tetrafluoroethylene units of 25:35:40, and having an intrinsic viscosity [θ] of 0.58 in tetrahydrofuran at 30° C.), and using a butyl acetate solution of this adhesive and the polymer C as a membrane material, a pellicle comprising a frame and a uniform membrane of about 1 $\mu$m thickness comprising the polymer C bonded to the frame was obtained in the same manner as in Example 6.

The obtained pellicle had adequate adhesion to air blow without elongation or sag of the membrane. This pellicle was evaluated by an irradiation test by means of a $F_2$ excimer laser light having a wavelength of 157 nm, to be used for photolithography, whereupon no separation of the membrane was confirmed even after irradiation of 10,000 pulse, and the adhesive also showed a good durability.

EXAMPLE 8

Using as an adhesive a vinylidene fluoride/hexafluoropropylene copolymer (copolymer having a content (mol %) of vinylidene fluoride units: hexafluoropropylene units of 78:22, and having an intrinsic viscosity [η] of 0.60 in tetrahydrofuran at 30° C.), and using an ethyl acetate solution of this adhesive and the polymer C as a membrane material, a pellicle comprising a frame and a uniform membrane of about 1 $\mu$m thickness comprising the polymer C bonded to the frame was obtained in the same manner as in Example 6.

The obtained pellicle had adequate adhesion to air blow without elongation or sag of the membrane. The pellicle was evaluated by an irradiation test by means of an $F_2$ excimer laser light having a wavelength of 157 nm, to be used for photolithography, whereupon no separation of the membrane was confirmed even after irradiation of 10,000 pulse, and the adhesive also showed a good durability.

EXAMPLE 9

9 g of the polymer E obtained in Example 5 and 91 g of perfluorotributylamine were put in a flask made of glass, followed by heating at 50° C. for 24 hours with stirring. As a result, a uniform colorless and transparent solution without turbidity was obtained. The solution was coated on a polished glass plate by spin coating at a spin rate of 500 rpm for 10 seconds and at 4,000 rpm for 20 seconds, followed by heat treatment for 1 hour at 80° C. and further for 1 hour at 180° C. to obtain a uniform transparent membrane on the glass plate.

Then, using a perfluorotributylamine solution of the adhesive E, the above glass plate having the membrane of the polymer E formed thereon was press-bonded on an aluminum frame having the adhesive E coated thereon in the same manner as in Example 6, to obtain a pellicle comprising an aluminum frame and a uniform self-supporting membrane of about 1 $\mu$m thickness comprising the polymer E bonded to the frame. This pellicle was evaluated by an irradiation test by means of a $F_2$ excimer laser, whereupon significant loss or breakage of the membrane comprising the polymer E occurred, and it could not be used. Further, separation of the membrane was observed, and durability of the adhesive E was also inadequate.

EXAMPLE 10

Each of the solutions of the polymers A to D and the polymer E used in Examples 6 and 9 was coated on a polished glass plate by spin coating in the same manner as mentioned above, followed by drying to obtain a uniform transparent membrane of about 10 $\mu$m thickness. With respect to each of the obtained membranes, transmission of light was measured, and the results are shown in FIG. 1. It was found that a light having a wavelength of 157 nm was transmitted through each of the membranes comprising the polymers A to D with a high transmission, but substantially no light having a wavelength of 157 nm was transmitted through the membrane comprising the polymer E.

The pellicle using the fluorine-containing polymer (A) of the present invention has a high transmission at the short-wavelength region at a wavelength of at most 200 nm (particularly at most 180 nm), and has a high durability against a short-wavelength laser light to be used for finer processing in the future. Accordingly, it has excellent effects as a dust-proof membrane for a mask to be used for next-generation photolithography, and is effective to improve the yield of products.

What is claimed is:

1. A photolithographic patterning process comprising:
  exposing with light having a wavelength of at most 200 nm in photolithography, which comprises using a pellicle comprising a frame and a pellicle membrane bonded to the frame by means of an adhesive, wherein the pellicle membrane or the adhesive comprises the following fluorine-containing polymer (A):
    a polymer or copolymer having monomer units formed by cyclic polymerization of monomer (d) represented by $CH_2=CR^7—Q—CR^8=CF_2$, wherein each of $R^7$ and $R^8$, which are independent of each other, is a hydrogen atom, a fluorine atom or a monovalent fluorine-containing organic group, and Q is a bivalent fluorine-containing organic group, and wherein the adhesive comprises a fluorine-containing polymer having a chain of carbon atoms as the main chain, carbon atoms having one or two hydrogen atoms bonded thereto and carbon atoms having no hydrogen atom bonded thereto and having a fluorine atom or a fluorine-containing organic group bonded thereto.

2. A photolithographic patterning process comprising:
exposing with light having a wavelength of at most 200 nm in photolithography, which comprises using a pellicle comprising a frame and a pellicle membrane bonded to the frame by means of an adhesive, wherein the pellicle membrane comprises the following fluorine-containing polymer (A):
a polymer or copolymer having monomer units formed by cyclic polymerization of monomer (d) represented by $CH_2=CR^7-Q-CR^8=CF_2$, wherein each of $R^7$ and $R^8$, which are independent of each other, is a hydrogen atom, a fluorine atom or a monovalent fluorine-containing organic group, and Q is a bivalent fluorine-containing organic group, and wherein the adhesive comprises a fluorine-containing polymer having a chain of carbon atoms as the main chain, carbon atoms having one or two hydrogen atoms bonded thereto and carbon atoms having no hydrogen atom bonded thereto and having a fluorine atom or a fluorine-containing organic group bonded thereto.

3. A photolithographic patterning process comprising:
exposing with light having a wavelength of at most 200 nm in photolithography, which comprises using a pellicle comprising a frame and a pellicle membrane bonded to the frame by means of an adhesive, wherein the adhesive comprises the following fluorine-containing polymer (A):
a polymer or copolymer having monomer units formed by cyclic polymerization of monomer (d) represented by $CH_2=CR^7-Q-CR^8=CF_2$, wherein each of $R^7$ and $R^8$, which are independent of each other, is a hydrogen atom, a fluorine atom or a monovalent fluorine-containing organic group, and Q is a bivalent fluorine-containing organic group, and wherein the adhesive comprises a fluorine-containing polymer having a chain of carbon atoms as the main chain, carbon atoms having one or two hydrogen atoms bonded thereto and carbon atoms having no hydrogen atom bonded thereto and having a fluorine atom or a fluorine-containing organic group bonded thereto.

4. The photolithographic patterning process according to claim 1, wherein the light having a wavelength of at most 200 nm is a fluorine gas excimer laser light.

5. The photolithographic patterning process according to claim 2, wherein the light having a wavelength of at most 200 nm is a fluorine gas excimer laser light.

6. The photolithographic patterning process according to claim 3, wherein the light having a wavelength of at most 200 nm is a fluorine gas excimer laser light.

7. The process according to claim it, wherein fluorine-containing polymer (A) is a copolymer having monomer units formed by polymerization of a fluorine-containing unsaturated alicyclic monomer which may have an oxygen atom as an atom constituting the ring, represented by $CFR^4=CR^5R^6$, wherein $R^4$ and $R^5$ together form a bivalent fluorine-containing organic group and $R^6$ is a fluorine atom or a monovalent fluorine-containing organic group, or $R^5$ and $R^6$ together form a bivalent fluorine containing organic group and $R^4$ is a fluorine atom or a monovalent fluorine-containing organic group, and monomer units formed by cyclic polymerization of monomer (d) represented by $CH_2=CR^7-Q-CR^8=CF_2$, wherein each of $R^7$ and $R^8$, which are independent of each other, is a hydrogen atom, a fluorine atom or a monovalent fluorine-containing organic group, and Q is a bivalent fluorine-containing organic group.

8. The process according to claim 2, wherein fluorine-containing polymer (A) is a copolymer having monomer units formed by polymerization of a fluorine-containing unsaturated alicyclic monomer which may have an oxygen atom as an atom constituting the ring represented by $CFR^4=CR^5R^5$ wherein $R^4$ and $R^5$ together form a bivalent fluorine-containing organic group and $R^6$ is a fluorine atom or a monovalent fluorine-containing organic group, or $R^5$ and $R^6$ together form a bivalent fluorine-containing organic group and $R^4$ is a fluorine atom or a monovalent fluorine-containing organic group, and monomer units formed by cyclic polymerization of monomer (d) represented by $CH_2=CR^7-Q-CR^8=CF_2$, wherein each of $R^7$ and $R^8$, which are independent of each other, is a hydrogen atom, a fluorine atom or a monovalent fluorine-containing organic group, and Q is a bivalent fluorine-containing organic group.

9. The process according to claim 2, wherein fluorine-containing polymer (A) is a copolymer having monomer units formed by polymerization of a fluorine-containing unsaturated alicyclic monomer which may have an oxygen atom as an atom constituting the ring, represented by $CFR^4=CR^5R^6$, wherein $R^4$ and $R^5$ together form a bivalent fluorine-containing organic group and $R^6$ is a fluorine atom or a monovalent fluorine-containing organic group, or $R^5$ and $R^6$ together form a bivalent fluorine-containing organic group and $R^4$ is a fluorine atom or a monovalent fluorine-containing organic group, and monomer units formed by cyclic polymerization of monomer (d) represented by $CH_2=CR^7-Q-CR^8=CF_2$, wherein each of $R^7$ and $R^8$, which are independent of each other, is a hydrogen atom, a fluorine atom or a monovalent fluorine-containing organic group, and Q is a bivalent fluorine-containing organic group.

10. The process according to claim 7, wherein monomer (d) is a monomer represented by $CH^2=CH-R^f-O-CF=CF_2$, wherein $R^f$ is a $C_{1-4}$ perfluoroalkylene group.

11. The process according to claim 8, wherein monomer (d) is a monomer represented by $CH_2=CH-R^f-O-CF=CF_2$, wherein $R^f$ is a $C_{1-4}$ perfluoroalkylene group.

12. The process according to claim 9, wherein monomer (d) is a monomer represented by $CH_2=CH-R^f-O-CF=CF_2$, wherein $R^f$ is a $C_{1-4}$ perfluoroalkylene group.

13. A photolithographic process comprising:
exposing with light having a wavelength of at most 200 nm in photolithography, which comprises using a pellicle comprising a frame and a pellicle membrane bonded to the frame by means of an adhesive wherein to pellicle membrane comprises the following fluorine-containing polymer (A): a polymer having monomer units formed by cyclic polymerization of monomer (d) represented by $CH_2=CR^7-Q-CR^8=CF_2$, wherein each of $R^7$ and $R^8$, which are independent of each other, is a hydrogen atom, a fluorine atom or a monovalent fluorine containing organic group, and Q is a bivalent fluorine-containing organic group, and wherein the adhesive comprises a propylene/vinylidene fluoride/tetrafluoroethylene copolymer.

14. The process according to claim 7, wherein the adhesive is a propylene/vinylidene fluoride/tetrafluoroethylene copolymer.

15. The process according to claim 13, wherein monomer (d) is a monomer represented by $CH_2=CH-R^f-O-CF=CF_2$, wherein $R^f$ is a $C_{1-4}$ perfluoroalkylene group.

16. The process according to claim 14, wherein monomer (d) is a monomer represented by $CH_2=CH-R^f-O-CF=CF_2$, wherein $R^f$ is a $C_{1-4}$ perfluoroalkylene group.

17. A photolithographic process comprising: exposing with light having a wavelength of at most 200 nm in photolithography, which comprises using a pellicle comprising a frame and a pellicle membrane bonded to the frame by means of an adhesive wherein the pellicle membrane comprises the following fluorine-containing polymer (A): a fluorine-containing polymer having a chain of carbon atoms as the main chain, and containing as carbon atoms in its main chain, carbon atoms having one or two hydrogen atoms bonded thereto and carbon atoms having no hydrogen atom bonded thereto and having a fluorine atom or a fluorine-containing organic group bonded thereto, and wherein the adhesive comprises a propylene/vinylidene fluoride/tetrafluoroethylene copolymer.

18. The process according to claim 17, wherein fluorine-containing polymer (A) is a fluorine-containing polymer having an alicyclic structure in its main chain, provided that a part of the atoms constituting the alicyclic structure may be oxygen atoms.

19. The process according to claim 17, wherein fluorine-containing polymer (A) is a fluorine-containing polymer having functional groups.

20. The pellicle according to claim 17, wherein fluorine-containing polymer (A) is a fluorine-containing polymer having no alicyclic structure in its main chain.

21. A photolithographic process comprising: exposing with light having a wavelength of at most 200 nm in photolithography, which comprises using a pellicle comprising a frame and a pellicle membrane bonded to the frame by means of an adhesive, wherein the adhesive comprises a propylene/vinylidene fluoride/tetrafluoroethylene copolymer.

* * * * *